US006369664B1

United States Patent
Muto et al.

(10) Patent No.: US 6,369,664 B1
(45) Date of Patent: Apr. 9, 2002

(54) VOLTAGE CONTROLLED OSCILLATOR AND ELECTRONIC APPARATUS USING SAME

(75) Inventors: Satoru Muto; Osamu Oe, both of Shiga-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/438,324

(22) Filed: Nov. 12, 1999

(30) Foreign Application Priority Data

Nov. 16, 1998 (JP) .......................................... 10-325029

(51) Int. Cl.[7] ................................................ H03B 5/18
(52) U.S. Cl. ............... 331/117 D; 331/99; 331/107 SL; 331/170 DP; 331/96; 455/255; 455/259; 455/262; 455/313
(58) Field of Search ................................ 332/163, 164; 331/107 SL, 107 DP, 117 D, 96, 177 V, 99; 455/255, 259, 262, 313

(56) References Cited

U.S. PATENT DOCUMENTS 4,075,580 A * 2/1978 Sunkler ........................ 331/96

OTHER PUBLICATIONS

Buchsbaum's Complete Handbook of Practical Electrical Reference Data 2nd, Ed., by Walter H. Buchsbaum, Prentice–Hall Inc. 1978, pp 34–37.*

* cited by examiner

Primary Examiner—Arnold Kinkead
(74) Attorney, Agent, or Firm—Burns, Doane, Swecker & Mathis, LLP

(57) ABSTRACT

A voltage controlled oscillator is provided which oscillates in a stable manner at a high frequency and obtains a large variable range of frequency. The oscillator includes a transistor, and distributed-constant line connected to the base of the transistor. The distributed-constant line has substantially 1/4 wavelength at the oscillation frequency of the oscillator, and has one open end. An inductance element is provided comprising a capacitor having a self-resonance frequency which is lower than the oscillation frequency. This inductance element is connected to the collector of the transistor. A varactor diode is connected to the capacitor.

13 Claims, 3 Drawing Sheets

US 6,369,664 B1

VOLTAGE CONTROLLED OSCILLATOR AND ELECTRONIC APPARATUS USING SAME

This application corresponds to Japanese Patent Application No. 10-325029, filed on Nov. 16, 1998, which is hereby incorporated by reference in its entirety.

BACKGROUND OF THE INVENTION

1. Field of the Invention

This invention relates to a voltage controlled oscillator and to an electronic apparatus using same. More particularly, the invention relates to a voltage controlled oscillator employed in an Electrical Toll Collection (ETC) system used for automatic toll collection, and to an electronic apparatus using same.

2. Description of the Related Art

Radio communication systems using high operating frequencies (approximately 6 GHz), such as current ETC radio communication systems, require a voltage controlled oscillator which serves as a source of a local signal having a frequency close to the operating frequency of the electromagnetic waves used by the system.

A circuit diagram of a conventional voltage controlled oscillator is shown in FIG. 4. FIG. 4 omits circuit elements which are not relevant to a basic discussion of the operation of the oscillator, such as a bias circuit, a choke circuit, and the like.

In FIG. 4, a voltage controlled oscillator 1 comprises of a transistor Q1 for providing oscillation, a resonator R1, a varactor diode (variable capacitance diode) VD, and capacitors C1, C2, C3 and C4. The resonator R1 is a microstrip line which has a ¼ or less wavelength and has one end grounded.

The base of the transistor Q1 is connected to the resonator R1 via the capacitor C3. Moreover, a connection point between the capacitor C3 and the resonator R1 is connected to the cathode of the varactor diode VD via the capacitor C4, and connected to a control voltage terminal 3. The anode of the varactor diode VD is grounded. In a high frequency band in which a device including the voltage controlled oscillator is used, the collector of the transistor Q1 is grounded via the capacitor C1. The capacitor C1 has low impedance at the oscillation frequency. The emitter of the transistor Q1 is connected to an output terminal 2 via the capacitor C2.

In this voltage controlled oscillator 1, the voltage applied to the control voltage terminal 3 is changed. Based on this change, the voltage applied between the anode and cathode of the varactor diode VD changes. Due to this voltage change, the capacitance between the anode and cathode of the varactor diode VD also changes. A resonance system is constituted by the resonator R1 and the varactor diode VD connected in parallel with the resonator R1 via the capacitor C4. The frequency of the entire resonance system is changed by changing the capacitance between the anode and cathode of the varactor diode VD. As a result, the oscillation frequency of the voltage controlled oscillator 1 can be changed.

The circuit diagram of another conventional oscillator is shown in FIG. 5. FIG. 5 uses the same symbols as FIG. 4 to denote the same or equivalent components, and description of these common components is omitted. Like FIG. 4, FIG. 5 also omits components which are not relevant to a basic discussion of the operation of the oscillator, such as a bias circuit, a choke circuit, and the like.

In the oscillator 5 shown in FIG. 5, the base of the transistor Q1, which is provided for oscillation, is connected to a distributed-constant line 6. The distributed-constant line 6 is an approximately ¼ wavelength line at the oscillation frequency. One end of the distributed-constant line 6 is open. A collector of the transistor Q1 is grounded via the capacitor C5. The self-resonance frequency of the capacitor C5 is lower than the oscillation frequency of the oscillator 5. The capacitor C5 operates as an inductance element at the oscillation frequency. Generally, a capacitor has a capacitance component, which operates as a capacitance element when the frequency is lower than the self-resonance frequency, and the capacitor has an inductance component, which operates as an inductance element when the frequency is higher than the self-resonance frequency.

In this oscillator 5, since the base of the transistor Q1 is grounded by the distributed-constant line 6 having an open end at the oscillation frequency, the transistor Q1 operates with the base grounded. The capacitor C5 functions as an inductance element. A Colpitts-type oscillation circuit is formed by the capacitance between the emitter and the collector and the capacitance formed between the emitter and the base. The capacitance between the emitter and the collector is not shown, since it is very small and is substituted by the stray capacitance of the emitter side circuit. The capacitance between the emitter and the base is not shown since it is also very small and is substituted by the internal capacitance of the transistor Q1.

The voltage controlled oscillator 1 of FIG. 4 satisfactorily operates at a relatively low frequency. However, as the oscillation frequency becomes higher, it becomes necessary to reduce the inductance value of the resonator R1 and the capacitance value of each capacitor. Variations in operating characteristics become large when the inductance and capacitive values become small. Stray capacitance also exerts a greater influence. Therefore, it has been difficult to obtain stable oscillation, particularly in the microwave band (3 GHz or greater).

On the other hand, stable oscillation of the oscillator 5 in FIG. 5 can be obtained at a relatively high frequency. However, in this range, the oscillator 5 does not operate as a voltage controlled oscillator.

SUMMARY OF THE INVENTION

It is an object of the present invention to solve the above-described problems. The present invention provides a voltage controlled oscillator which oscillates in a stable manner at a high frequency and which obtains a large variable range of frequency. The present invention also provides an electronic apparatus using this oscillator.

In order to achieve the above objects, a voltage controlled oscillator is provided comprising a transistor having a base, collector and emitter, for providing oscillation. A distributed-constant line is provided which is connected to the base of the transistor, the distributed-constant line having one open end and having substantially ¼ wavelength at an oscillation frequency of the oscillator. An inductance element is provided which is connected to the collector of the transistor, and a varactor diode is provided which is connected to the inductance element.

The inductance element can comprise a capacitor having a self-resonance frequency which is lower than the oscillation frequency of the oscillator.

Accordingly to another aspect of the invention, another distributed-constant line is provided having one open end and another end connected to ground, and having substantially ¼ wavelength at an oscillation frequency of the oscillator. The other distributed-constant line is arranged in parallel with and adjacent to the distributed-constant line which is connected to the base of the transistor.

Further, an electronic apparatus is provided which employs the above-described voltage controlled oscillator.

According to the above configuration, the voltage controlled oscillator oscillates in a stable manner at a high frequency. Also, a large variable frequency range can be obtained. The electronic apparatus of the present invention further offers a reduction in apparatus size and cost.

BRIEF DESCRIPTION OF THE DRAWINGS

The foregoing, and other, objects, features and advantages of the present invention will be more readily understood upon reading the following detailed description in conjunction with the drawings in which.

DETAILED DESCRIPTION OF THE PREFERRED EMBODIMENTS

Figure 1:
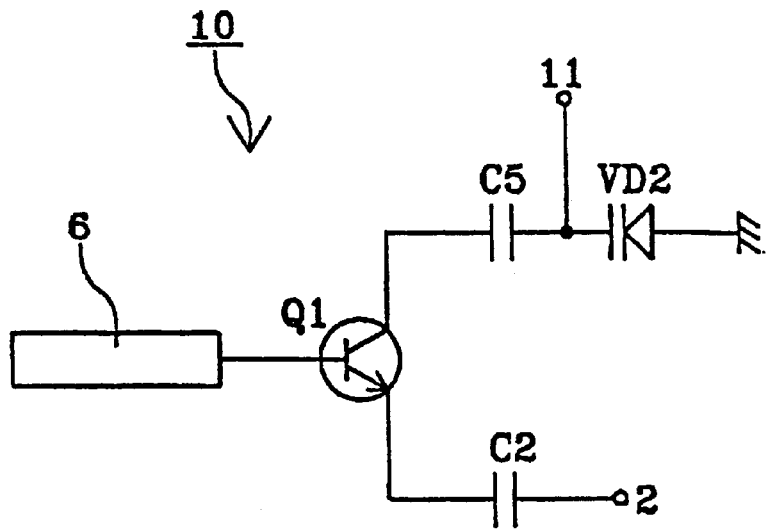
FIG. 1 is a circuit diagram showing a preferred embodiment of a voltage controlled oscillator of the present invention.
Figure 5:
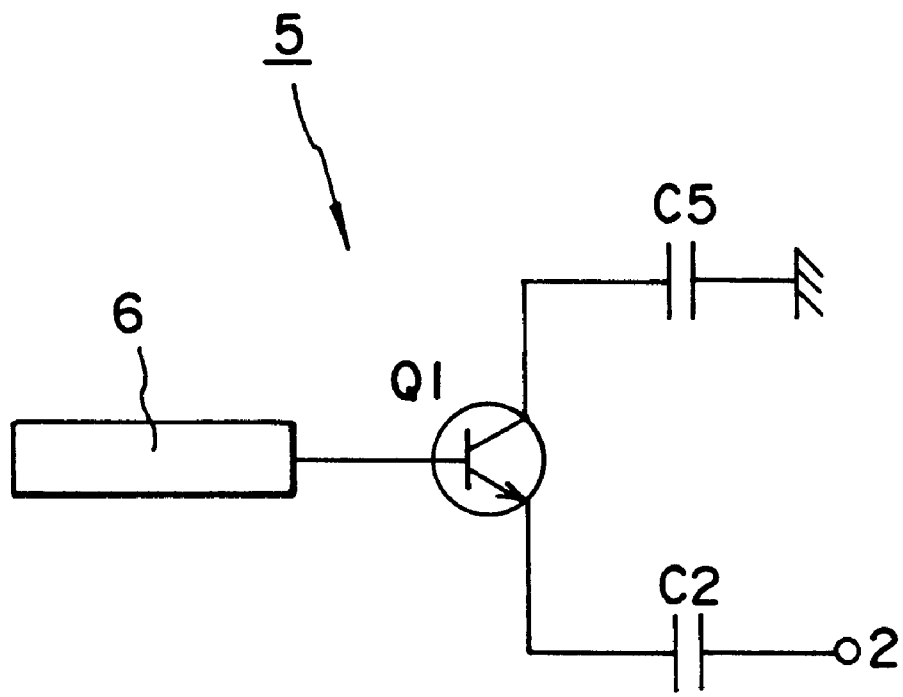
FIG. 5 is a circuit diagram showing another conventional oscillator.

A preferred embodiment of the voltage controlled oscillator of the present invention is shown in FIG. 1. FIG. 1 uses the same symbols as FIG. 5 to denote the same or equivalent components. Description of these common components is omitted. FIG. 1 also omits circuit element which are not relevant to a basic discussion of the operation of the oscillator, such as a bias circuit, a choke circuit, and the like.

In FIG. 1, the collector of the transistor Q1 is connected to the cathode of a varactor diode VD2 via a capacitor C5. The anode of the varactor diode VD2 is grounded. The cathode of the varactor diode VD2 is connected to the control voltage terminal 11. The capacitor C5 and the varactor diode VD2 each have a self-resonance frequency which is lower than the oscillation frequency of the oscillator 10. Both capacitor C5 and the varactor diode VD2 each function as an inductance element at the oscillation frequency. Furthermore, the capacitor C5 functions as a capacitance element for cutting off direct current such that voltage applied to the varactor diode VD2 is not applied to the collector of the transistor Q1. The capacitor C5 also functions as an inductance element.

Further, at a frequency higher than the self-resonance frequency, the varactor diode VD2 changes the inductance value based on the voltage applied between its anode and the cathode. Therefore, the voltage controlled oscillator 10 can change the inductance component of the inductance element connected to the collector of the transistor Q1 to a relatively great extent based on the voltage applied to the control voltage terminal 11.

According to experiments made by the inventors, the oscillation frequency can be changed by 50 MHz from 5.95 GHz to 6.00 GHz (control voltage sensitivity 25 MHz/V) by changing the voltage applied to the control voltage terminal 11 of the voltage controlled oscillator 10 from 0.5 V to 2.5 V.

Figure 2:
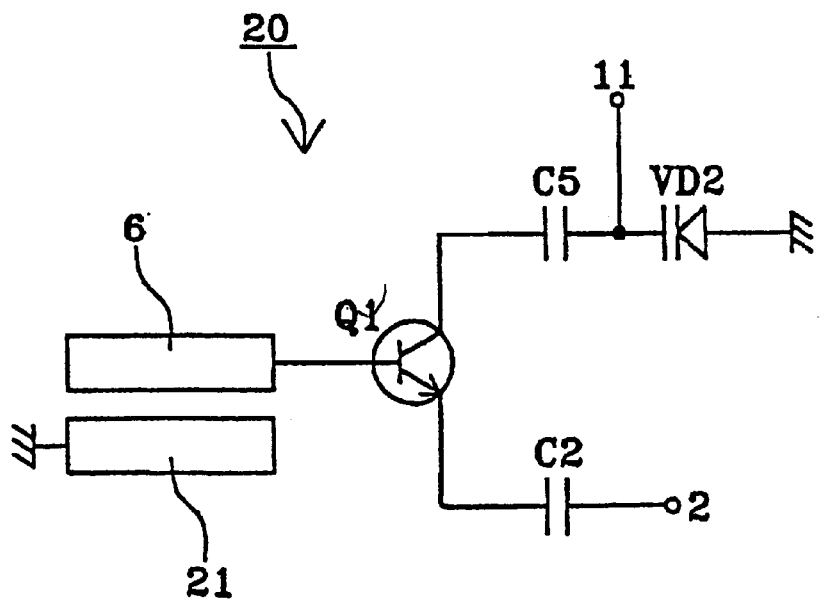
FIG. 2 is a circuit diagram showing another preferred embodiment of a voltage controlled oscillator of the present invention.

Another preferred embodiment of the voltage controlled oscillator of the present invention is shown in FIG. 2. FIG. 2 uses the same symbols as FIG. 1 to denote the same or equivalent components. Description of these common components is omitted. FIG. 2 also omits circuit elements which are not relevant to a basic discussion of the operation of the oscillator, such as a bias circuit, a choke circuit, and the like.

In the voltage controlled oscillator 20 shown in FIG. 2, another distributed-constant line 21 is provided. The distributed-constant line 21 has substantially ¼ wavelength. One end is open and the opposite end is grounded. The distributed-constant line 21 is arranged in parallel with and adjacent to the distributed-constant line 6. The distributed-constant line 21 may comprise a microstrip line, for example.

In the above configuration, the distributed-constant line 6 and the distributed-constant line 21 are coupled together. The reflection phase characteristics at the oscillation frequency become more pronounced (e.g., steeper), viewing the distributed-constant line 6 from the base of the transistor Q1. Due to this, the C/N ratio (carrier-to-noise ratio or phase noise) of the oscillation signal of the voltage controlled oscillator 20 can be improved.

In addition, in each of the above-described embodiments, a capacitor having a self-resonance frequency which is lower than the oscillation frequency is used as the inductance element connected to the collector of the transistor Q1. Alternatively, an inductance element having a wiring pattern with predetermined length and width can be used, or a discrete inductance element such as chip inductor can be used.

A microstrip line is used in the above-discussed configurations of FIGS. 1 and 2. However, other kinds of distributed-constant lines can be used, such as a strip line, coplanar line or slot line.

Figure 3:
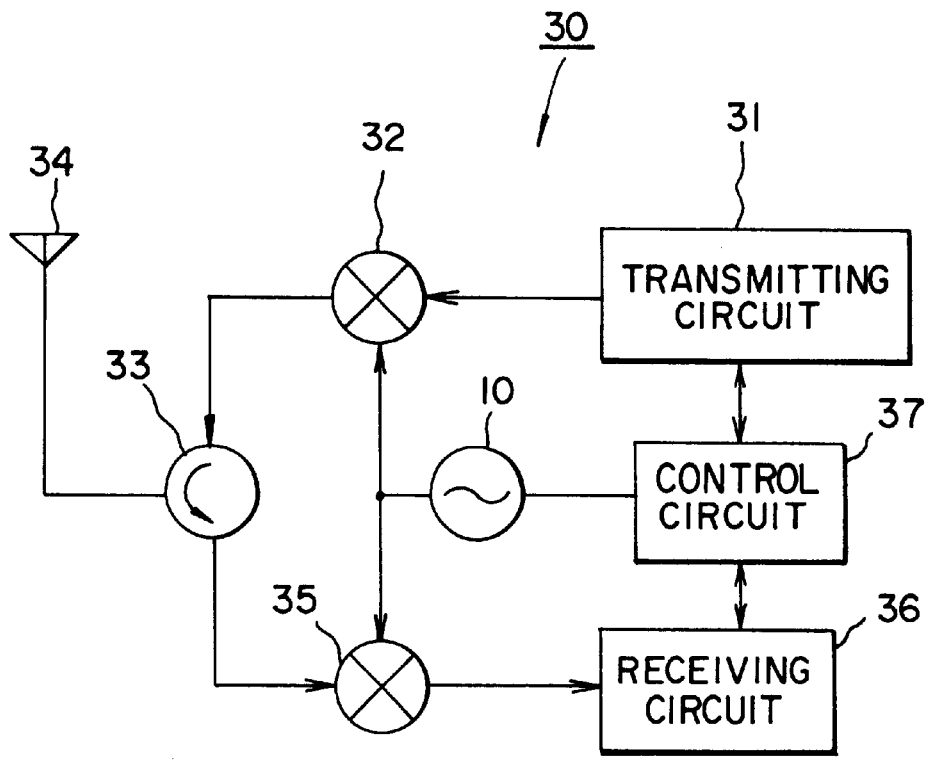
FIG. 3 is a block diagram showing a preferred embodiment of an electronic apparatus of the present invention.
Figure 4:
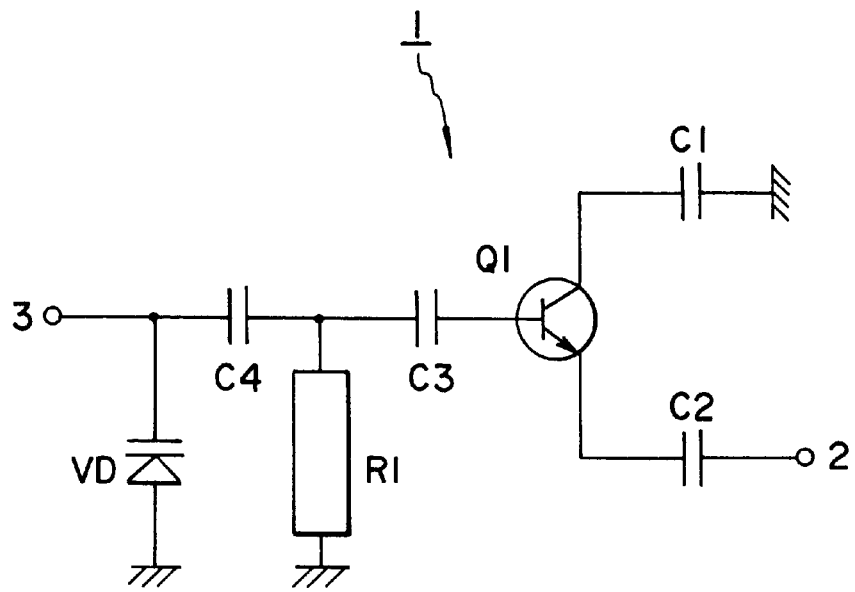
FIG. 4 is a circuit diagram showing a conventional voltage controlled oscillator.

A preferred embodiment of an electronic apparatus of the present invention is shown in FIG. 3. More specifically, FIG. 3 is a conceptual block diagram of an apparatus equipped for use in an automobile in an ETC system. Only principal portions of this circuit are shown. For instance, components such as amplifiers, filters and the like are omitted to facilitate discussion. The electronic apparatus 30 comprises a transmitting circuit 31, a mixer 32, a circulator 33, an antenna 34, a mixer 35, a receiving circuit 36, a control circuit 37, and the voltage controlled oscillator 10. The transmitting circuit 31 is connected to the mixer 32. The mixer 32 is connected to the antenna 34 via the circulator 33. The circulator 33 is connected to the mixer 35. The output of the mixer 35 is connected to the receiving circuit 36. The transmitting circuit 31 and the receiving circuit 36 are both connected to the control circuit 37. The output of the control circuit 37 is connected to the control voltage terminal of the voltage controlled oscillator 10. The output of the voltage controlled oscillator 10 is divided into two branches. One branch is connected to the mixer 32 and the other is connected to the mixer 35.

In the electronic apparatus 30, the voltage controlled oscillator 10 can switch the frequency which is input into the mixers 32 and 35 based on instructions sent by the control circuit 37 in accordance with a transmitting frequency, a receiving frequency, and an usable channel.

In the electronic apparatus 30, by using the voltage controlled oscillator 10 of the present invention, a high frequency signal (e.g., approximately 6 GHz in this case) can be directly obtained. This allows a reduction in space (i.e., size) and cost, compared with the configuration in which a voltage controlled oscillator having a low frequency is connected to a frequency converter.

In addition, although in the above description the voltage controlled oscillator 10 is used, the voltage controlled oscillator 20 can alternatively be used.

The electronic apparatus is not limited for use in an automobile in an ETC system. For instance, it can be used in a device installed in or on a road in an ETC system, or in a totally different (e.g., non-ETC) system.

According to the present invention, the voltage controlled oscillator comprises a transistor for providing oscillation, a distributed-constant line connected to the base of the transistor having one open end and having substantially ¼ wavelength, an inductance element connected to the collector of the transistor, and a varactor diode connected to the inductance element. According to this configuration, the voltage controlled oscillator can oscillate in a stable manner at a high frequency and obtain a large variable range of frequency. A capacitor can be used as the inductance element, having a self-resonance frequency which is lower than the oscillation frequency. Moreover, carrier-to-noise ratio is improved by providing another distributed-constant line having substantially ¼ wavelength. One end of the other distributed-constant line is open and the other end is grounded. This other distributed-constant line is arranged in parallel with and adjacent to the first-mentioned distributed-constant line so as to be coupled to this first-mentioned line.

Moreover, a reduction in space and cost can be achieved in the electronic apparatus described above by using the voltage controlled oscillator of the present invention.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A voltage controlled oscillator, comprising:
   a transistor having a base, collector and emitter, for providing oscillation;
   a distributed-constant line connected to the base of the transistor, the distributed-constant line having one open end and having substantially ¼ wavelength at an oscillation frequency of the oscillator;
   an inductance element having one end connected to the collector of the transistor; and
   a varactot diode connected to another end of the inductance element,
   wherein the emitter of the transistor is connected to an output terminal via a capacitor.

2. The voltage controlled oscillator according to claim 1, wherein said inductance element is a capacitor having a self-resonance frequency which is lower than the oscillation frequency of the oscillator.

3. The voltage controlled oscillator according to claim 1, further comprising:
   another distributed-constant line having one open end and another end connected to ground, and having substantially ¼ wavelength at an oscillation frequency of the oscillator,
   wherein said other distributed-constant line is arranged in parallel with and adjacent to the distributed-constant line which is connected to the base of the transistor.

4. The voltage controlled oscillator according to claim 1, wherein a control terminal is connected to a cathode of said varactor diode, and an anode of said varactor diode is connected to ground.

5. The voltage controlled oscillator according to claim 1, wherein said oscillator is configured to provide a signal having a frequency of 3 GHz or greater.

6. An apparatus for use in a communication system, comprising:
   an antenna;
   a receiving circuit connected to the antenna;
   a transmitting circuit connected to the antenna; and
   a voltage controlled oscillator for providing an output which modifies an input of the receiving circuit and an output of the transmitting circuit;
   wherein said oscillator includes:
      a transistor having a base, collector and emitter, for providing oscillation;
      a distributed-constant line connected to the base of the transistor, the distributed-constant line having one open end and having substantially ¼ wavelength at an oscillation frequency of the oscillator;
      an inductance element having a first end connected to the collector of the transistor; and
      a varactor diode connected to a second end of the inductance element,
   wherein the emitter of the transistor is connected to an output terminal via a capacitor.

7. The apparatus according to claim 6, wherein said inductance element is a capacitor having a self-resonance frequency which is lower than the oscillation frequency of the oscillator.

8. The apparatus according to claim 6, the oscillator further comprising:
   another distributed-constant line having one open end and another end connected to ground, and having substantially ¼ wavelength at an oscillation frequency of the oscillator,
   wherein said other distributed-constant line is arranged in parallel with and adjacent to the distributed-constant line which is connected to the base of the transistor.

9. The apparatus according to claim 6, wherein a control terminal is connected to a cathode of said varactor diode, and an anode of said varactor diode is connected to ground.

10. The apparatus according to claim 6, wherein said oscillator is configured to provide a signal having a frequency of 3 GHz or greater.

11. The apparatus according to claim 6, further comprising:
    a control circuit;
    a first mixer; and
    a second mixer,
    wherein the first mixer is connected between the antenna and the transmitting circuit, and receives the output of the oscillator,
    wherein the second mixer is connected between the antenna and the receiving circuit, and also receives the output of the oscillator, and
    wherein an output of the control circuit is connected to a control terminal of the oscillator.

12. The apparatus according to claim 11, wherein the control terminal is connected to a cathode of the varactor diode of the oscillator.

13. The apparatus according to claim 6, wherein the communication system is a system for automatically paying tolls.

* * * * *